(12) United States Patent
Svilans

(10) Patent No.: US 6,556,599 B1
(45) Date of Patent: Apr. 29, 2003

(54) EXTERNAL CAVITY LASER USING ANGLE-TUNED FILTER AND METHOD OF MAKING SAME

(75) Inventor: Mikelis Nils Svilans, Kanata (CA)

(73) Assignee: Bookham Technology plc, Abingdon (GB)

(*) Notice: Subject to any disclaimer, the term of this patent is extended or adjusted under 35 U.S.C. 154(b) by 293 days.

(21) Appl. No.: 09/688,873

(22) Filed: Oct. 17, 2000

(51) Int. Cl.⁷ ................................................ H01S 3/10
(52) U.S. Cl. .......................... 372/20; 372/92; 372/98; 372/99
(58) Field of Search ............................. 372/20, 92, 98, 372/99

(56) References Cited

U.S. PATENT DOCUMENTS

| | | | |
|---|---|---|---|
| 3,967,211 A | * 6/1976 | Itzkan et al. | 372/32 |
| 4,583,226 A | 4/1986 | Liou | 372/19 |
| 4,923,270 A | 5/1990 | Carger | 350/96 |
| 4,942,583 A | * 7/1990 | Nazarathy et al. | 372/20 |
| 5,077,747 A | * 12/1991 | Hemmer et al. | 372/20 |
| 5,140,599 A | * 8/1992 | Trutna, Jr. et al. | 372/20 |
| 5,161,165 A | 11/1992 | Zorabedian | 372/20 |
| 5,177,750 A | 1/1993 | Zorabedian | 372/20 |
| 5,386,426 A | * 1/1995 | Stephens | 372/20 |
| 5,530,714 A | 6/1996 | Vilhelmsson et al. | 372/92 |
| 5,668,823 A | 9/1997 | Harrison et al. | 372/50 |
| 5,684,623 A | 11/1997 | King et al. | 359/346 |
| 5,691,989 A | 11/1997 | Rakuljic et al. | 372/20 |
| 6,205,159 B1 | 3/2001 | Sesko et al. | |

FOREIGN PATENT DOCUMENTS

WO  WO 00/24095  4/2000 ............. H01S/3/10

OTHER PUBLICATIONS

*Interference–filter–tuned, alignment–stabilized, semiconductor external–cavity laser*, P. Zorabedian and W.R. Trutna, Jr.; Optical Society of America, Optics Letters, vol. 13, No. 10, Oct. 1988.

*Single–longitudinal–mode stabilized graded–index–rod external coupled–cavity laser*, K.Y. Liou, C.A. Burrus, R.A. Linke, I.P. Kaminow, S.W. Granlund, C.B. Swan and P. Besomi, Appl. Phys. Lett. 45(7), Oct. 1, 1984, American Institute of Physics.

*242 nm continuous tuning from a GRIN–SC–MQW–BH InGaAsP laser in an extended cavity*, Electronic Letters Feb. 15, 1990, vol. 26, No. 4.

* cited by examiner

Primary Examiner—Leon Scott, Jr.
(74) Attorney, Agent, or Firm—Lahive & Cockfield, LLP

(57) ABSTRACT

An external cavity laser comprises a light source unit, preferably comprising a semiconductor light source having internal optical gain and a collimating lens, for supplying substantially collimated light to a retroreflector via an angle-tuned filter extending across an optical axis of the light source. The retroreflector is positioned so as to receive light from the light source via the angle-tuned filter and reflect the light via the angle-tuned filter back to the light source. The retroreflector may comprise a quarter pitch graded-index (GRIN) lens having a proximal end surface oriented towards the light source and a distal end surface opposite thereto, with a mirror provided on the distal end surface, preferably as a high-reflectance coating. The angle-tuned filter may be attached to the proximal end surface of the GRIN lens, preferably as a coating. The GRIN lens may be tilted in order to vary the angle of the filter relative to the optical axis and hence the wavelength. Where the external cavity laser is to be wavelength-adjustable in use, the external cavity laser may further comprise a tuning mechanism for tilting the angle-tuned filter. Alternatively, the tilt angle of the angle-tuned filter may be adjusted and then fixed during manufacture using a separate tilting mechanism which is not a part of the external cavity laser itself.

21 Claims, 2 Drawing Sheets

EXTERNAL CAVITY LASER USING ANGLE-TUNED FILTER AND METHOD OF MAKING SAME

TECHNICAL FIELD

This invention relates to external cavity lasers of the kind which employ a retroreflector and an intra-cavity angle-tuned filter, and is applicable to both tunable lasers and fixed-wavelength lasers. The invention is also applicable to a method of making such fixed-wavelength lasers.

BACKGROUND ART

It is well known to add an external cavity to a semiconductor laser to increase intensity at a given wavelength. It is also known to use a fiber grating in the external cavity to select the wavelength at which the laser emits. If only one output wavelength is desired, a simple grating may suffice. If more than one wavelength is required, however, it is known to use a bulk diffraction grating and tilt it relative to the optical axis of the laser to select different operating wavelengths. It is also known for an external cavity laser that is tunable to different wavelengths to have a mirror and an angle-tuned filter forming the external cavity. A disadvantage of the bulk grating kind of external cavity laser is that it tends to be rather bulky. Although angle-tuned filter external cavity lasers are less bulky, a disadvantage they share with bulk grating designs is that the mechanical system for tilting the filter, like the grating, must be very precise, which tends to increase manufacturing costs by an unacceptable amount. Moreover, the precision tuning mechanism is very susceptible to changes in temperature, mechanical vibration, and so on.

An improved design of angle-tuned external cavity laser was disclosed by Zorabedian in a paper entitled "Interference Filter Tuned, Alignment Stabilized, Semiconductor External Cavity Laser", Optics Letters, Vol. 13, No. 10, pp. 826–828, October 1988. The angle-tuned filter is positioned between the laser and a retroreflector formed by a converging lens and a mirror, the latter extending through the focal point of the lens. Because the reflection is at the focal length of the lens, this so-called "degenerate cavity" reduces the effect of the orientation of the mirror upon the accuracy with which the light can be returned to the laser and improves performance.

Although Zorabedian's design reduces the requirement for the precise positioning of the mirror, cost savings and reduced losses are not fully realised because the number of discrete components is increased, which tends to complicate assembly and increase the cost of manufacture.

Hence, known designs are still expensive to make to achieve the necessary precision and ensure that losses are acceptable.

DISCLOSURE OF INVENTION

The present invention seeks to eliminate or at least mitigate the disadvantages of such known external cavity lasers.

According to one aspect of the present invention, there is provided an external cavity laser comprising light source means with internal optical gain for providing substantially collimated light, an angle-tuned filter extending across an optical axis of the light source and a retroreflector positioned so as to receive said light from the light source via the angle-tuned filter and reflect the light via the angle-tuned filter back to the light source, wherein the retroreflector comprises a unitary element.

Preferably, the retroreflector comprises a quarter-pitch graded-index (GRIN) lens having a proximal end surface oriented towards the laser and a distal end surface opposite thereto, and a mirror provided on said distal end surface.

The mirror may comprise a coating upon the distal end surface or a separate component bonded to it by suitable optical adhesive.

The angle-tuned filter may comprise a discrete filter separate from the GRIN lens, or bonded to the GRIN lens. Alternatively, the filter may be coated upon the proximal end surface using thin film filter techniques. In the latter case, the tilting mechanism will be arranged to rotate the GRIN lens and with it the angle-tuned filter so as to adjust the tilt angle. The tilt axis around which the GRIN lens is rotated need not intersect the optical axis so long as the filter and the retroreflector remain in the path taken by the light beam.

In preferred embodiments, the angle-tuned filter and the mirror are provided on the proximal and distal end surfaces, respectively, of a GRIN lens, each preferably as a coating, and the tilting mechanism tilts the GRIN lens so as to adjust the angle of the filter relative to the optical axis of the laser.

The angle of inclination of the angle-tuned filter relative to the optical axis, in use, may be fixed or adjustable. In the latter case, therefore, the external cavity laser will further comprise means for adjusting the angle of inclination of the angle-tuned filter.

In the case of a fixed-wavelength external cavity laser, the angle-tuned filter will be adjustable during manufacture using separate adjusting means, which is not part of the external cavity laser, then fixed at a desired tilt angle.

According to a second aspect of the invention, therefore, there is provided a method of making an external cavity laser comprising the steps of assembling a light source means with internal optical gain for supplying substantially collimated light, an angle-tuned filter and a retroreflector with the angle-tuned filter extending across an optical axis of the light source, the retroreflector being positioned so as to receive light from the light source via the angle-tuned filter and reflect the light to pass via the angle-tuned filter back to the light source, adjusting the angle of the angle-tuned filter relative to the optical axis to a predetermined angle, and fixing the angle-tuned filter at that angle.

In embodiments of this second aspect of the invention, the angle-tuned filter may be provided on a GRIN lens and the adjustment of the angle of the angle-tuned filter effected by rotating the GRIN lens relative to the optical axis.

Various features, advantages and objects of the invention will become apparent from the following description, taken in conjunction with the accompanying drawings, of a preferred embodiment which is described by way of example only.

BEST MODE(S) FOR CARRYING OUT THE INVENTION

Figure 1:
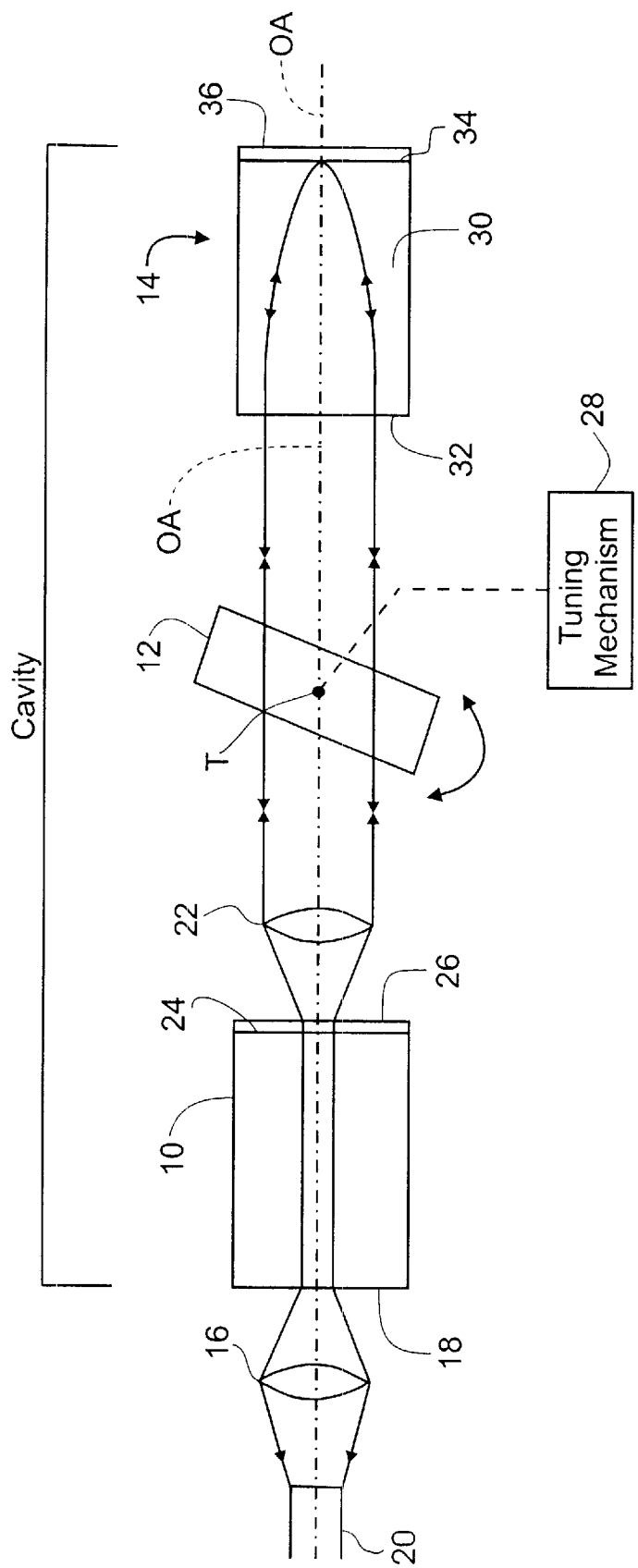
FIG. 1 is a schematic block diagram of a semiconductor laser with an external cavity formed by an angle-tuned filter and a retroreflector formed by a GRIN lens and a mirror.

In the drawings, corresponding components in the different Figures have the same reference numeral, but in some cases with a suffix.

The external cavity laser illustrated in FIG. 1 comprises a semiconductor light source 10, an angle-tuned filter 12, conveniently a narrowband transmission filter with a −3 dB bandwidth from 0.1 nm to 10.0 nm, for example, and a unitary retroreflector 14. A first lens 16 focuses light for output from a rear facet 18 of the light source 10 into, for example, an optical fiber 20 and a second lens 22 at the opposite end of the light source 10 collimates light from a front facet 24 of the light source 10 and directs it through the angle-tuned filter 12 with the beam axis substantially parallel to an optical axis OA common to both the light source 10, lens 22 and angle-tuned filter 12. An anti-reflection coating 26 is provided on the front facet 24.

The orientation of the optical axis OA is determined by the relative alignment of the light source 10 and the collimating lens 22. The light source 10 has internal optical gain and, with the collimating lens 22, constitutes a light source means for supplying substantially collimated light to the angle-tuned filter 12.

A tilting mechanism 28, of known construction, tilts the angle-tuned filter 12 about an axis T orthogonal to the optical axis OA so as to select different wavelengths for transmission to the retroreflector 14 and thereby tune the output frequency of the laser. The retroreflector 14 comprises a graded-index (GRIN) lens 30, for example a SELFOC lens, having a proximal end surface 32 adjacent the angle-tuned filter 12 and a distal end surface 34 remote therefrom. A mirror 36 is provided at the distal end surface 36 of the GRIN lens 30, conveniently as a high-reflectance coating. The GRIN lens 30 is a one-quarter pitch lens, so that it will focus the collimated light at the mirror 36. The light will reflect back along a substantially parallel path, through the angle-tuned filter 12 and back into the light source 10. Hence, the external cavity extends between the mirror 36 and the rear facet 18 of the light source 10.

Where the external cavity laser is of the fixed-wavelength kind, during manufacture, the light source 10, retroreflector 14 and angle-tuned filter 12 will be assembled as shown in FIG. 1. While monitoring the frequency/wavelength of the light from the light source 10 using a suitable device (not shown) at the output 20, the angle-tuned filter 12 will be rotated by the tuning mechanism 28 relative to the optical axis OA to tune a prescribed output frequency/wavelength. The angle-tuned filter 12 then will be fixed at that tilt angle using any suitable means (not shown) such as cement, UV epoxy, and so on; the tilting mechanism may then be removed.

Where the external cavity laser is to be tunable in use, however, the tilting mechanism 28 will be a part thereof and used, during normal use of the external cavity laser, to tune the output frequency/wavelength. Of course, the angle-tuned filter 12 will not then be fixed but will be left free to rotate.

Although the optical axis of the GRIN lens 30 preferably will be aligned with the optical axis OA, it has been found that it does not have to be aligned precisely; the GRIN lens 30 will still reflect the light back into the light source 10 accurately while it is misaligned by up to, say, 20 or 30 degrees.

Figure 2:
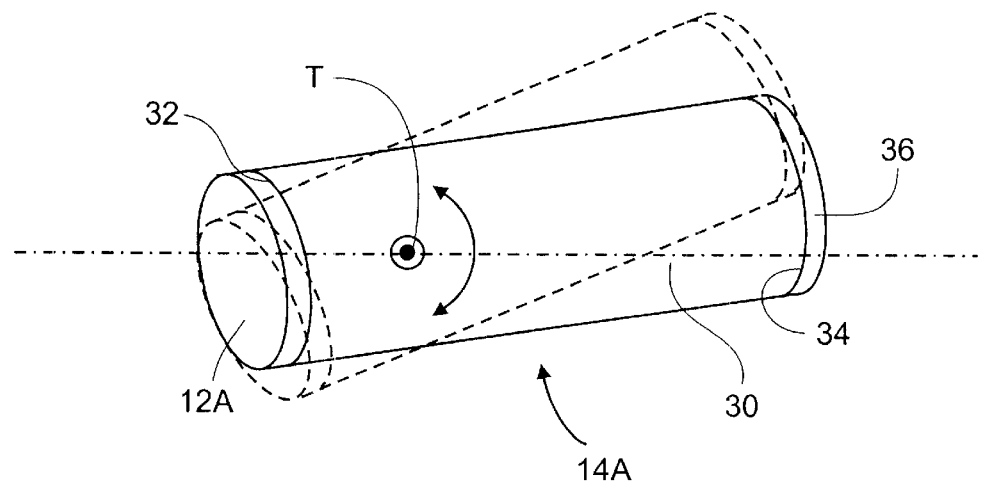
FIG. 2 illustrates a first embodiment in which the angle-tuned filter is provided on the GRIN lens and the GRIN lens is tilted about an axis substantially perpendicular to its optical axis.

In the embodiment shown in FIG. 1, the angle-tuned filter 12 is rotated about axis T in order to tilt it relative to the optical axis OA and tune the laser, but the GRIN lens 30 is fixed. FIG. 2 illustrates an alternative embodiment in which the angle-tuned filter 12A is provided directly upon the proximal end surface 32 of the GRIN lens 30, which is mounted so that its cylindrical axis is rotatable relative to the optical axis OA. The tuning mechanism (not shown in FIG. 2), which again may be of known construction, rotates the GRIN lens 30 about the pivot axis T which is orthogonal to the optical axis OA, as before. As the GRIN lens 30 rotates, the angle between the angle-tuned filter 12A and the optical axis OA varies. The mirror 36 is provided, as before, on the distal end surface 34 of the GRIN lens 30.

The other components, namely the light source 10 and the lenses 16 and 22, are not shown in FIG. 2, but may be identical to those described with reference to FIG. 1.

Figure 3:
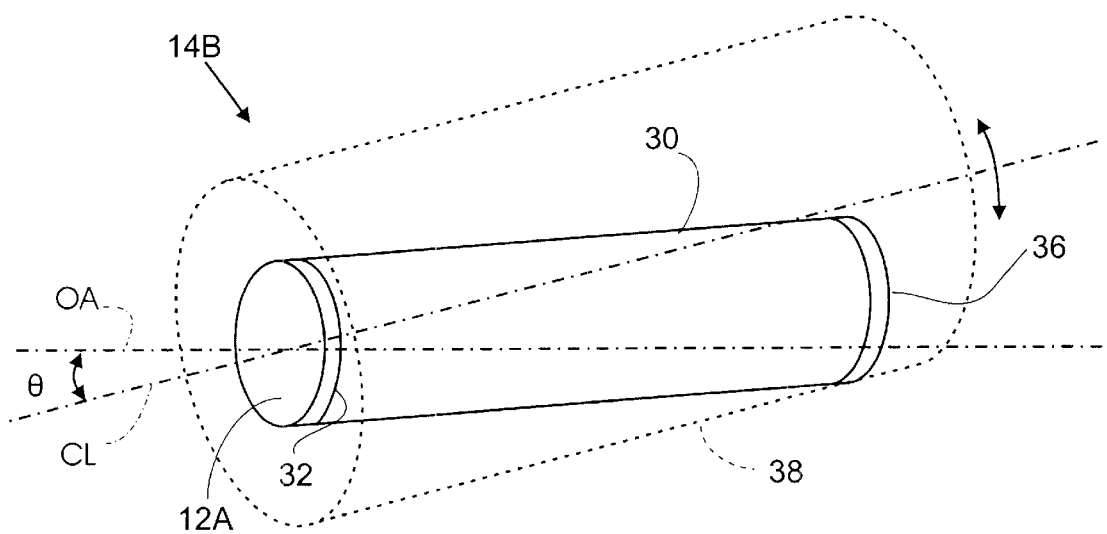
FIG. 3 illustrates a second embodiment in which the angle-tuned filter is provided on the GRIN lens and the GRIN lens is tilted about an axis inclined slightly to the optical axis.

FIG. 3 illustrates a third embodiment of the invention which is similar to the embodiment of FIG. 2 in that the angle-tuned filter 12A and mirror 36 are provided upon the proximal and distal end surfaces 32 and 34, respectively, of the GRIN lens 30, but differs in that the GRIN lens 30 is mounted and rotated differently. Thus, in the 30 external cavity laser shown in FIG. 3, the GRIN lens 30 is mounted in a cylindrical mount 38 with the cylindrical axis of the GRIN lens 30 inclined relative to the cylindrical axis CL of the mount 38 by an angle θ of about 5°–10°. The tuning mechanism (not shown) rotates the mount 38 about its cylindrical axis CL and the ensuing rotation of the GRIN lens 30 causes the required change in the tilt angle between the angle-tuned filter 12A and the optical axis OA. As the filter/GRIN lens combination is rotated about the axis CL, the laser wavelength is finely tuned since, for a rotation of the filter/GRIN lens assembly through 180°, the filter plane is tilted through the angle 2θ with respect to the optical axis OA. Accordingly, an advantage of the embodiment shown in FIG. 3 is that it may provide for finer adjustment of the tilt angle and hence finer tuning of the output frequency/wavelength.

It should be appreciated that the embodiments described with reference to FIGS. 2 and 3 may be provided as fixed-wavelength or tunable external cavity lasers, in a manner analogous to that described with reference to the embodiment of FIG. 1, i.e., the tuning mechanism being either a separate device used during manufacture to set the tilt angle of the GRIN/filter combination, and then removed, or provided as part of the external cavity laser to allow tuning of the wavelength during normal use.

A significant advantage of fixed-wavelength embodiments of the invention, as compared with the traditionally manufactured distributed feedback (DFB) laser, is improved manufacturability.

It is envisaged that, in the external cavity lasers illustrated (partially) in FIGS. 2 and 3, where the GRIN lens 30 itself is rotated to tune the laser output wavelength, a variation of up to 20 degrees in the tilt angle will be practical. Typically, 10 to 20 degrees of rotation will be sufficient, and will be practical since there is a trade-off between the number of wavelength channels which can be selected and the precision, which limits the angle of rotation. At larger angles, the angular sensitivity of the angle-tuned filter 12/12A tends to increase nonlinearly as the cosine of the angle and also the reflectance of the retro-reflecting mirror 36 will tend to diminish, especially if, as expected, it is provided by coating the distal end surface 34, In any of the above-described embodiments of the invention, if it were preferred to extract light via the distal end surface 34 of the GRIN lens 30, the reflectance of the mirror 36 would be reduced appropriately, for example to about 60 to 80 per cent according to the particular application. Otherwise, the mirror 36 typically will be a high-reflectance coating of more than 90 per cent reflectance.

Figure 4:
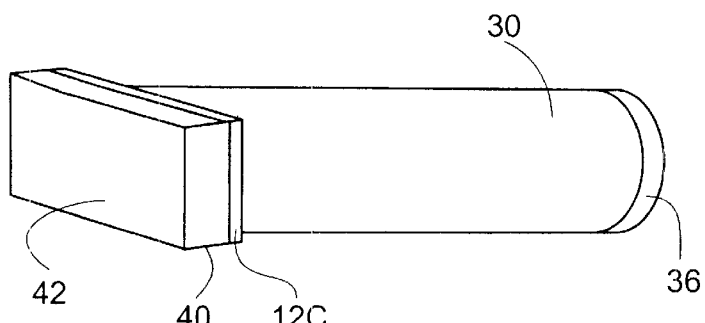
FIG. 4 illustrates an alternative retroreflector construction.

FIG. 4 illustrates a modification applicable to either of the embodiments of FIGS. 2 and 3. Thus, as shown in FIG. 4, the angle-tuned filter 12C is coated onto one surface of a substrate 40 of dielectric material, e.g. glass, bonded to the proximal end surface of the GRIN lens 30 by suitable optical adhesive (not shown). The substrate 40 may be specially chosen for its desired spectral properties, e.g. to provide spectral flattening of the output power spectrum of the laser. Alternatively, and perhaps preferably, a suitable filter could be provided elsewhere in the cavity, conveniently as an additional coating on the distal edge of the GRIN lens 30. The back side 42 of the substrate 40 is either suitably anti-reflection (AR) coated, or the thickness of the substrate 40 is tapered such that etalon effects are avoided within the filter substrate and spurious reflections from the backside are substantially eliminated.

The invention embraces other modifications. For example, the semiconductor light source 10 could be replaced by any other suitable source, such as a plasma device, an optical fiber amplifier, and so on.

The GRIN lens 30 may be coated, on either end, with a coating that optimizes tuning, for example by compensating for spectral characteristics of the laser. Thus, as stated above, for example, the coating may compensate for variations in the power spectrum of the light source so that the output power spectrum of the external cavity laser is substantially flat.

It should be noted that, while the GRIN lens 30 is preferred, the invention embraces other forms of unitary retroreflector, such as a corner cube or a compound convex lens with a mirror on a facet thereof, which yield the same advantageous ease of manufacture because they do not involve separate, air-spaced retroreflector elements.

Moreover, although the above-described embodiments have the filter attached to the GRIN lens by cement, other attachment means may be employed.

INDUSTRIAL APPLICABILITY

The above-described embodiments of the present invention have the significant advantage that they are compact and easy to manufacture. Embodiments which provide the angle-tuned filter upon one end of the GRIN lens are more rugged and facilitate accurate alignment. An additional advantage of embodiments in which both the angle-tuned filter and the mirror are formed by coating the GRIN lens is that the manufacturing cost is considerably reduced and the precision enhanced.

Another advantage is that only one type of generic semiconductor light source 10 covering, for example, a spectral range of 70 nm–100 nm in the near infrared spectrum, may be needed, reducing stocking requirements.

What is claimed is:

1. An external cavity laser comprising light source means with internal optical gain for providing substantially collimated light, an angle-tuned filter extending across an optical axis of the light source means and a retroreflector positioned so as to receive said light from the light source means via the angle-tuned filter and reflect the light via the angle-tuned filter back to the light source, wherein the retroreflector comprises a unitary element.

2. An external cavity laser according to claim 1, wherein the retroreflector comprises a quarter-pitch graded-index (GRIN) lens having a proximal end surface oriented towards the light source and a distal end surface opposite thereto, and a mirror provided on said distal end surface.

3. An external cavity laser according to claim 1, wherein the angle-tuned filter is separate from the retroreflector.

4. An external cavity laser according to claim 2, wherein the angle-tuned filter is attached to the proximal end surface of the GRIN lens.

5. An external cavity laser according to claim 4, wherein the angle-tuned filter is bonded to said proximal end surface.

6. An external cavity laser according to claim 4, wherein the angle-tuned filter comprises a coating upon said proximal end surface.

7. An external cavity laser according to claim 2, wherein the mirror comprises a coating upon said distal end surface.

8. An external cavity laser according to claim 7, wherein the mirror comprises a high reflectance coating.

9. An external cavity laser according to claim 2, where one surface of the GRIN lens has a multilayer coating having spectral characteristics predetermined to tend to flatten the output power spectrum of the laser.

10. An external cavity laser according to claim 2, wherein a multilayer coating is provided on the distal end surface of the GRIN lens and comprises both the mirror and means for compensating for spectral characteristics of the light source.

11. An external cavity laser according to claim 1, wherein the angle-tuned filter is adjustable to vary its angle of inclination relative to the optical axis, the external cavity laser further comprising adjustment means for adjusting said angle of inclination.

12. An external cavity laser according to claim 11, wherein the angle-tuned filter is separate from the retroreflector.

13. An external cavity laser according to claim 11, wherein the retroreflector comprises a quarter-pitch graded-index (GRIN) lens having a proximal end surface oriented towards said light source and a distal end surface opposite thereto, and a mirror provided on said distal end surface, the angle-tuned filter is attached to said proximal end of the GRIN lens and the means for adjusting the angle-tuned filter tilts the GRIN lens so as to vary the angle of the angle-tuned filter relative to said optical axis.

14. An external cavity laser according to claim 13, wherein the angle-tuned filter is adhered to said proximal end surface.

15. An external cavity laser according to claim 13, wherein the angle-tuned filter comprises a coating upon said proximal end surface.

16. An external cavity laser according to claim 15, wherein the mirror comprises a coating upon said distal end surface.

17. An external cavity laser according to claim 16, wherein the mirror comprises a high reflectance coating.

18. An external cavity laser according to claim 11, where one surface of the GRIN lens has a coating having spectral characteristics predetermined to tend to flatten the output power spectrum of the laser.

19. An external cavity laser according to claim 11, wherein a multilayer coating provided on the distal end surface of the GRIN lens comprises both the mirror and means for compensating for spectral characteristics of the light source.

20. A method of making an external cavity laser comprising the steps of assembling a light source means with internal optical gain for supplying substantially collimated light, an angle-tuned filter and a retroreflector with the angle-tuned filter extending across an optical axis of the light source, the retroreflector being positioned so as to receive light from the light source via the angle-tuned filter and reflect the light to pass via the angle-tuned filter back to the light source, adjusting the angle of the angle-tuned filter relative to the optical axis to a predetermined angle, and fixing the angle-tuned filter at that angle.

21. A method according to claim 20, wherein the retroreflector comprises a GRIN lens having a mirror on one end surface and the angle-tuned filter attached to an opposite end surface, and the adjustment of the angle of the angle-tuned filter is effected by rotating the GRIN lens relative to the optical axis.

* * * * *